United States Patent [19]

Ohyama et al.

[11] 4,404,617
[45] Sep. 13, 1983

[54] HIGH-FREQUENCY CIRCUIT DEVICE HAVING A CIRCUIT BOARD FIXED TO A SHIELD CASING BY PROJECTIONS OF THE SHIELD CASING AND SOLDERING

[76] Inventors: Sadahiro Ohyama, No. 1474-12, Chigasaki, Chigasaki-City, Kanagawa-ken; Hiroshi Kato, No. 2-16-7, Tsurukawa, Machida-City, Tokyo; Kazuo Matsukawa, No. 667, Takakura, Fujisawa-City, Kanagawa-ken, all of Japan

[21] Appl. No.: 282,222

[22] Filed: Jul. 10, 1981

Related U.S. Application Data

[63] Continuation of Ser. No. 63,555, Aug. 3, 1979, abandoned.

[30] Foreign Application Priority Data

Sep. 14, 1978 [JP] Japan .................................. 53-112942
Aug. 3, 1979 [JP] Japan ........................... 54-108173[U]

[51] Int. Cl.³ ............................................. H05K 5/04
[52] U.S. Cl. ................................. 361/424; 174/35 R; 211/41; 248/346; 334/85; 455/348
[58] Field of Search ................... 455/347, 348; 334/85; 174/35 R, 52 R; 361/392, 395, 399, 422, 424; 211/41; 248/678, 346

[56] References Cited

U.S. PATENT DOCUMENTS

| | | | |
|---|---|---|---|
| 3,365,621 | 1/1968 | Von Fange | 334/85 |
| 3,524,137 | 8/1970 | Redfield | 455/348 |
| 3,721,746 | 3/1973 | Knappenberger | 361/424 |
| 3,770,889 | 11/1973 | Gutschick | 455/348 |
| 3,816,911 | 6/1974 | Knappenberger | 174/35 R |

FOREIGN PATENT DOCUMENTS

| | | |
|---|---|---|
| 1766661 | 3/1972 | Fed. Rep. of Germany . |
| 1938332 | 2/1976 | Fed. Rep. of Germany . |
| 54-136907 | 9/1979 | Japan . |

*Primary Examiner*—G. P. Tolin
*Attorney, Agent, or Firm*—Anthony H. Handal

[57] ABSTRACT

A high-frequency circuit device comprises a metal shield casing comprising side walls having projection parts projected innerwards and a plate-like member accommodated within the casing in contact with and fixed to the projection parts by dip-soldering. The plate-like member is either a printed circuit board having circuit elements mounted thereon or a shield plate segment for defining and shielding spaces above the printed circuit board.

10 Claims, 15 Drawing Figures

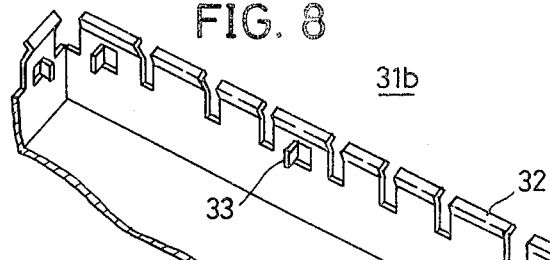
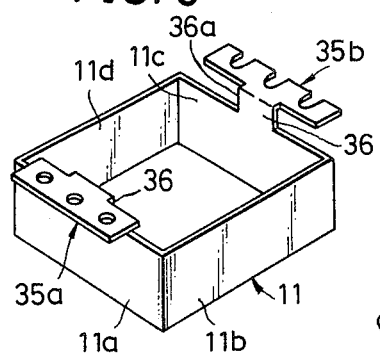
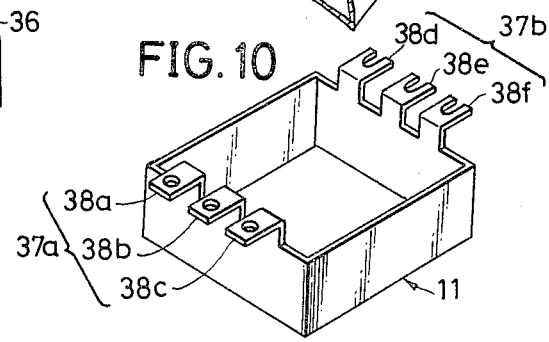
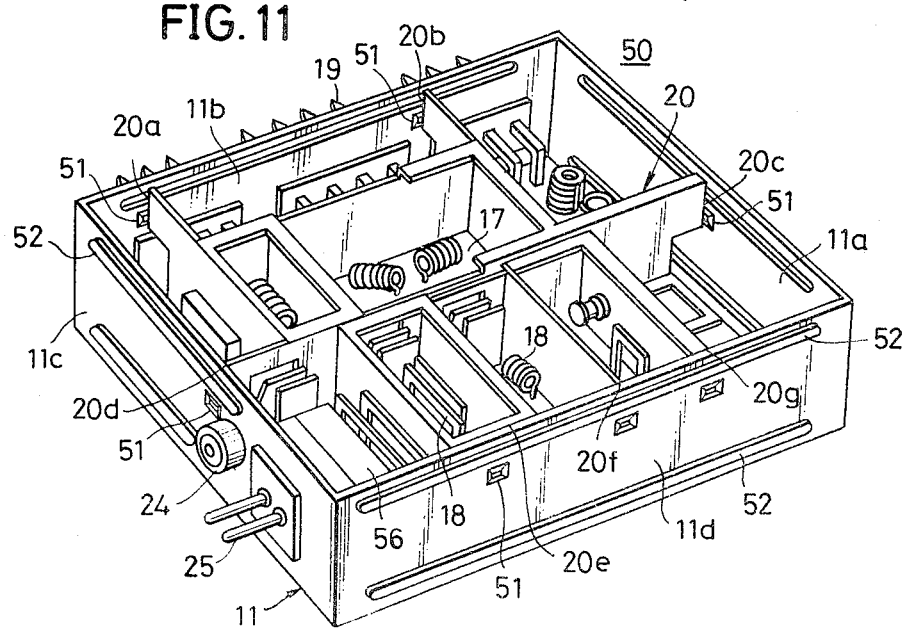

HIGH-FREQUENCY CIRCUIT DEVICE HAVING A CIRCUIT BOARD FIXED TO A SHIELD CASING BY PROJECTIONS OF THE SHIELD CASING AND SOLDERING

This is a continuation of application Ser. No. 63,555 filed Aug. 3, 1979, and now abandoned.

BACKGROUND OF THE INVENTION

This invention relates generally to high-frequency circuit devices, and more particularly to a high-frequency circuit device in which a plate-like member such as a printed circuit board, a shield plate structure and the like are accommodated within and fixed to a square-frame-formed casing. The plate-like member, making contact with an inwardly projecting part of the casing, is fixed to the casing through dip-soldering operation.

A typical example of a high-frequency circuit device is the electronic tuning type tuner unit for UHF which has a printed circuit board having shield plate segments projecting thereabove accommodated within a shield casing. Generally speaking, printed circuit boards of this type includes a number of circuits such as an antenna circuit, an RF circuit, a mixer circuit, an oscillator circuit, and an IF circuit, all of which are provided with their circuit elements. A plurality of shield plate segments are mounted on the printed circuit board or assembled along the boundaries of the individual circuits to shield the circuits from each other.

One example of a tuner unit known hitherto has adopted a mechanism for fixing a printed circuit board to a casing, in which mechanism the printed circuit board is fitted inside the casing together with a shield plate structure and is then fixed indirectly to the casing by soldering the shield plate structure to the inside surface of the casing. Accordingly, this fixing structure involves disadvantages in that, the setting or positioning of the printed circuit plate and the shield plate structure is apt to become unstable during the soldering work, thus degrading precision. Moreover, as the soldering work is carried out manually, the number of fabricating processes is large.

Furthermore, another example of a known tuner unit is of a construction in which a printed circuit board is accommodated within a casing in engagement with a slit-and-bent part inside the casing and is soldered and fixed thereto. This conventional construction has the same disadvantage as the construction just described, namely that the soldering work is performed manually thus causing instability in the positioning of the printed circuit board.

SUMMARY OF THE INVENTION

It is a general object of the present invention to provide a novel and useful high-frequency circuit device in which the above described difficulties have been overcome.

Another and specific object of the invention is to provide a high-frequency circuit device in which a plurality of projection parts are formed in a shield casing on an inner side wall at its lower part, and a printed circuit board is brought into contact engagement with the projection parts and is then fixed through dip soldering, whereby the printed circuit board is accommodated within the casing. Here, the printed circuit board is positioned at the lower part of the casing side wall and is fixed through dip-soldering and this results in certain merits which will be described later.

Still another object of the present invention is to provide a high-frequency circuit device in which L-shaped mounting lugs are formed by extending top ends of the opposing side plates or walls of a casing, and the casing is adapted to be mounted on a chassis, for example, by way of the mounting lugs. Because of the mounting lugs, the printed circuit board can be subjected to dip-soldering operation with ease.

A further object of the present invention is to provide a high-frequency circuit device in which a shield plate structure projecting above a printed circuit board is accommodated within a casing in contact engagement near the top of the lateral end surfaces thereof with a plurality of internal projection parts which are formed on the shield case side walls at their upper parts, and is then subjected to dip-soldering, thus fixing the shield plate structure to the casing and further the shield plate segments to each other. Adoption of dip-soldering reduces the number of soldering processes and improves the strength and precision of the solder joints.

Other objects and further features of the invention will be apparent from the following detailed description when read in conjunction with the accompanying drawings.

BRIEF DESCRIPTION OF THE DRAWING

In the drawings:

FIG. 8 is a fragmentary perspective view showing one embodiment of a bottom casing cover of the tuner unit;

FIGS. 9 and 10 are perspective views respectively showing other embodiments of the shield casing in the tuner unit;

FIGS. 11 and 12 are perspective views showing another embodiment of the tuner unit before and after being subjected to dip-soldering.

DETAILED DESCRIPTION OF THE INVENTION

Figure 1:
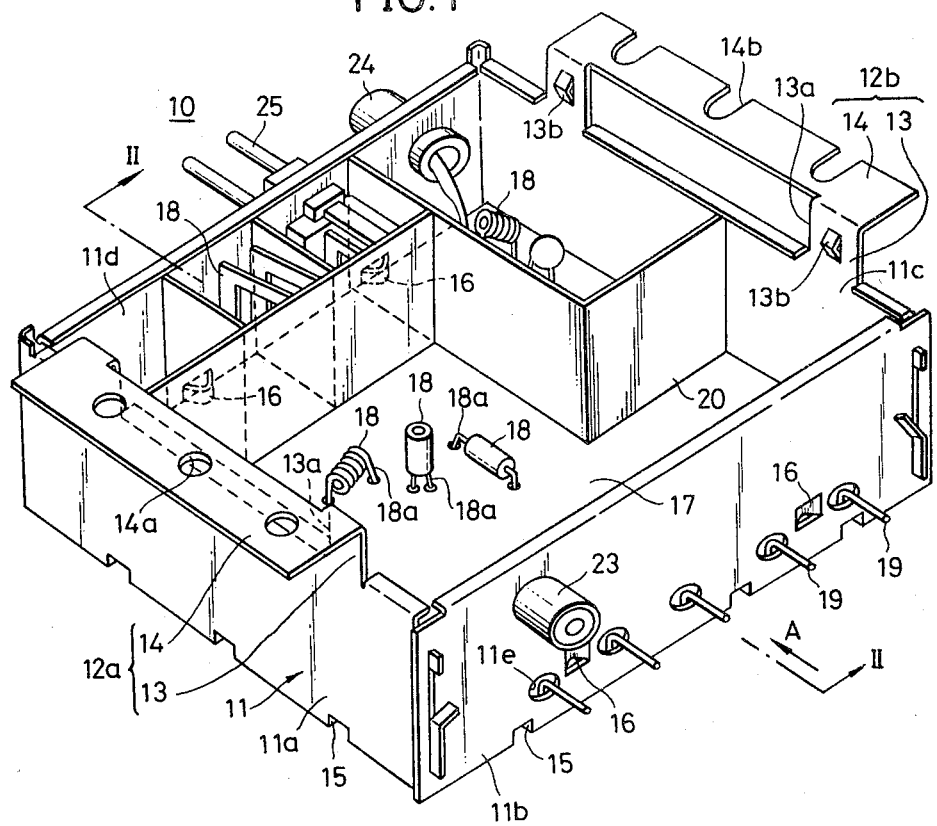
FIG. 1 is a perspective view showing a tuner unit as a first embodiment of the high-frequency circuit device according to the present invention.
Figure 2:
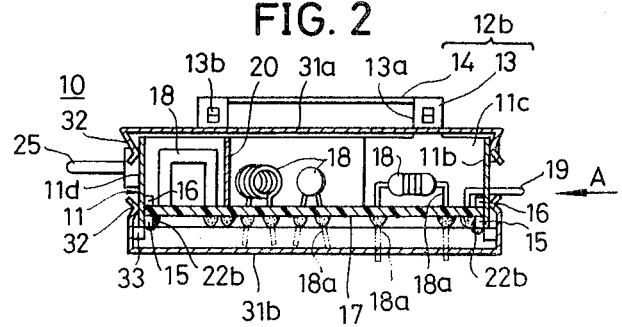
FIG. 2 is a vertical sectional view taken along the line II—II in FIG. 1 as viewed in the arrow direction.
Figure 3:
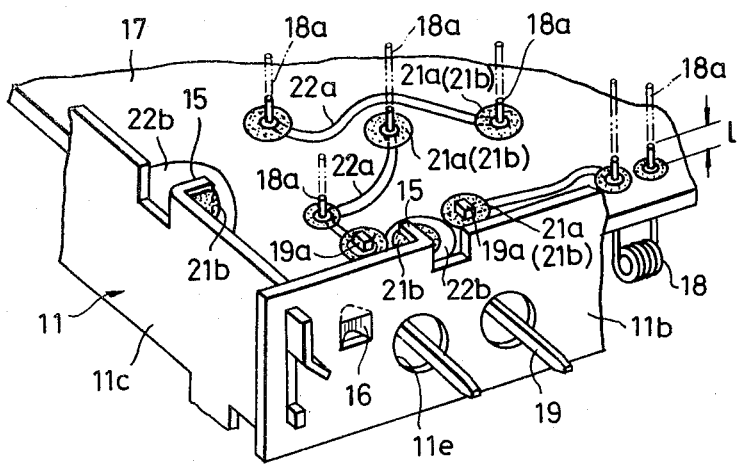
FIG. 3 is a perspective view of an essential part of the tuner unit as viewed from the bottom thereof.

A description is first given of the structural arrangement of a high-frequency circuit device according to the present invention, in conjunction with FIG. 1 through FIG. 3.

Referring to FIG. 1, a UHF electronic tuning type tuner unit 10 includes a square-frame-formed tuner casing 11 which has four side walls 11a through 11d. The side wall 11b is a separate member and is adapted to be mounted together with a printed circuit board 17 described hereinafter. The top parts of the opposing side walls 11a and 11c, which have no input and output terminals mounted thereon, extend upwards and are bent into L-shape, thus forming a pair of lugs 12 (12a and 12b) for mounting the casing 11 in the apparatus in which it is to be used. Each mounting lug 12 comprises an extension part 13 and a mounting plate part 14. Each extension part 13 is formed with a square opening 13a. The mounting plate part 14 of the mounting lug 12a has several holes 14a formed therein, and the mounting plate part 14 of the mounting lug 12b has several U-shaped cuts 14b. On the internal side of the extension part 13 of the mounting lug 12b, are press formed a pair of projection parts 13b.

Figure 4:
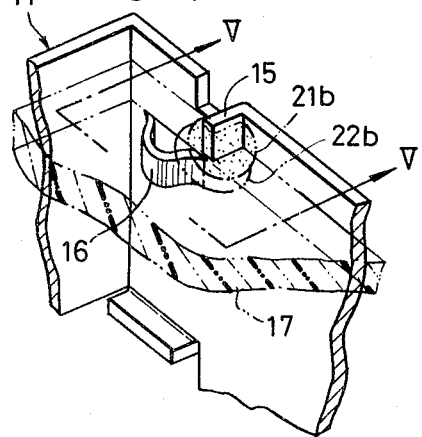
FIG. 4 is a fragmentary perspective view, from the bottom side, showing one embodiment of a mechanism for engaging a printed circuit board with a casing in the tuner unit.
Figure 5:
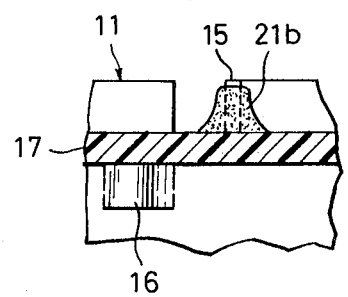
FIG. 5 is a vertical section taken along the line V—V in FIG. 4.

The side walls 11a through 11d of the casing 11 have a plurality of slit-and-bent parts 15 formed at specific positions on their lower edges as indicated in FIG. 3 through FIG. 5 (in which the casing is shown upside down). The slit-and-bent parts 15 are formed by bending a part cut along an L-shaped groove at the lower edge of the casing walls. Furthermore, a pair of projection parts 16 are provided on each of side walls 11b and 11d at specific positions near the lower edges thereof. Each projection part 16 is formed by cutting two lateral and parallel slits in the side wall and inwardly deforming the part therebetween to form a bridge-like projection. These projection parts 16 are not essential, but they effectively serve to position the printed circuit board 17 in the fixing operation.

The board 17 has circuit parts 18 and L-shaped terminals 19 mounted thereon with their terminal leads 18a and terminal parts 19a projecting below the board 17, and further has a shield plate segment 20 mounted thereon, as indicated in FIG. 1 through FIG. 3. This board 17 is subjected to a first dip-soldering operation before it is mounted in the shield casing 11 in FIG. 3, and the terminal leads 18a and the terminal parts 19a are thereby provisionally fixed to a specific conductor pattern 22a on the lower surface of the board in an electrically conductive state. Thereafter, the terminal leads 18a projected below the board 17 are cut substantially flush with the lower edge of the casing 11, and the lead parts indicated by two-dot-chain lines in FIG. 3 are removed. The projecting length l of the terminal leads 18a is thus made as short as about 1 mm to 2 mm.

Following this, the board 17 is slidingly inserted into a U-shaped casing 11 (to which no side wall 11b has yet been attached) from the open side thereof. The direction of insertion is indicated by an arrow A in FIGS. 1 and 2. During insertion, the board 17 is guided by the slit-and-bent parts 15 on the opposing side walls 11a and 11c. The board 17 is then fitted to the casing 11 with its distal edge thereof engaged between the slit-and-bent parts 15 and the projection parts 16 on the left side wall 11d in FIG. 2. Then, when the separate side wall 11b is fixed to the U-shaped casing, the proximal edge of the board 17 is brought into engagement with and restricted betwen a set of slit-and-bent parts 15 and projection parts 16 on the side wall 11b. This fabrication pricess may be modified in a manner such that the board 17 and the side wall 11b are firstly fixed together to form a unitary sub-assembly structure, and the sub-assembly structure is then fitted to the U-shaped casing 11. In either case, the board 17 is provisionally fitted into the casing 11 engaged at its lateral edges between the four projection parts 16 on the side walls 11b and 11d and the plurality of cut and bent parts 15 on the side walls 11a through 11d, and is thus positively prevented from moving in the vertical direction.

Here, since only the opposing side walls 11d and 11b are provided with the projection parts 16 which serve to restrict the free movement of the board 17 in cooperation with the slit-and-bent parts 15, the fabrication process of installing the printed circuit board 17 can be carried out with ease. It might be considered advantageous to us a structural arrangement wherein the projection parts 16 are provided in the side walls 11a and 11c in addition to the side walls 11d and 11b since the printed circuit board would then come into engagement at its four lateral sides between the slit-and-bent parts and the projection parts. Engagement in this manner is, however, impossible in practical application. Furthermore, in the case where the projection parts 16 are not formed, the board 17 will be provisionally fitted so as not to displace vertically by means of the shield plate segment (denoted by 20 in FIGS. 11 and 12) described hereinafter.

When the board 17 is fitted as described above, each of the L-shaped terminals 19 projects side ways through a hole 11e formed in the side wall 11b. The L-shaped terminals 19 thus projected are used for supplying power, grounding, and checking the circuits for each frequency band of the channel signals. An IF output terminal 23 is mounted on the side wall 11b and a VHF antenna input terminal 24 and a UHF antenna input terminal 25 are fixed to the sidewall 11d.

The L-shaped terminals 19 may be alternatively mounted on the board 17 from the bottom thereof with the terminal part 19a thereof inserted through the board 17. In this structural arrangement, the terminal part 19a at the lower part of the board 17 is fixed and electrically connected to a specific conductor pattern 22a by means of a mass of solder 21a formed by dip-soldering. The solder 21a also adheres to the terminal 19 itself but this does not give rise to any problems. In the case where the terminal 19 projecting from the side wall 11b is to be connected to another circuit, operation can be carried out more easily if the terminal 19 is free from the solder 21a. Accordingly, when the terminal 19 is to be connected to a separate circuit, it is preferable to mount the terminal 19 from above the board 17.

Thereafter, the lower part of the casing 11 (board 17) is subjected to the second dip-soldering operation. This dip-soldering operation electrically connects the lead terminals 18a to the specific conductor pattern 22a. At the same time, each of the slit-and-bent parts 15 is soldered and electrically connected to the specific ground pattern 22b by a mass of solder 21b as indicated in FIGS. 3 and 4.

The pair of mounting plate parts 12a and 12b are formed above the casing 11. Accordingly, the second dip-soldering operation can be easily carried out with the casing held by the mounting plate parts 12a and 12b. Moreover, the masses of solder 21b adhere to the inner and outer side surfaces of the casing 11 only at small areas near the lower edge of the casing 11 and can therefore be easily covered by a fastening part 32 of a bottom cover 31b. Thus the outside appearance of the device is not impaired.

Figure 6:
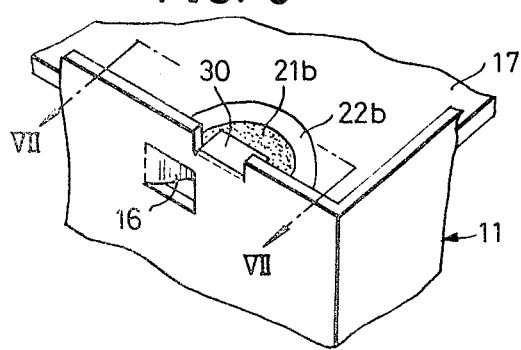
FIG. 6 is a fragmentary perspective view, as viewed from the bottom side, showing another embodiment of the printed circuit board-casing engagement mechanism.
Figure 7:
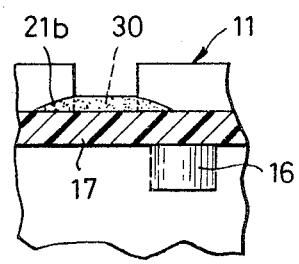
FIG. 7 is a vertical sectional view taken along the lines VII—VII in FIG. 6 as viewed in the arrow direction.

Furthermore, instead of the slit-and-bent part 15 in the above described embodiment, it is possible to use a bent part 30 formed by bending innerwards a part defined between a pair of parallel slits extending vertically from the lower edge of the casing 11, as indicated in FIGS. 6 and 7. The board 17 is engaged between the bent parts 30 and the projection parts 16, and the bent parts 30 are fixed and electrically connected to the ground pattern 22b by masses of solder 21b.

Comparing the constructions shown in FIG. 5 and FIG. 7, it will be noted that the slit-and-bent part 15 shown in FIG. 5 facilitates the adherence of a relatively large amount of solder 21b to obtain a solder joint of ideal shape which provides sufficient mechanical strength. Furthermore, in the case where the casing 11 is pre-coated with tin, for example, the construction indicated in FIG. 5 is more advantageous. This is because, in the slit-and-bent part 15 indicated in FIG. 5, a major part of the solder 21b adheres to the pre-coated surface of the part 15 with good adhesiveness, whereas in the slit-and-bent part 30 indicated in FIG. 7, a major part of the solder 21b adheres to the cut surface with poor adhesiveness.

Referring back to FIG. 2, a top cover 31a has an elastic fastening part 32 formed around its periphery, and is attached to the top of the casing 11 with the fastening part 32 pressing against the external side surface of the casing 11. The fastening part 32 confronting the lugs 12a and 12b passes through the openings 13a and comes into pressing contact with the external side surface of the casing 11. Therefore, the fastening part 32 of the cover 31a makes pressing contact with a substantial part of the periphery of the casing 11. Consequently, the cover 31a is firmly retained on the casing 11 in a play free state and, moreover, this cover helps to improve the electric shielding characteristics of the casing. The position of attachment of the cover 31a is defined by cutouts in cooperation with the pair of projection parts 13b.

The bottom cover 31b is of the same structure as the top cover member 31a, except for slit-and-bent parts 33 which are additionally formed at specific positions, as indicated in FIG. 8. This cover member 31b is attached to the bottom of the casing 11 by causing the fastening part 32 to press against the side walls thereof, with the position of attachment being determined by the contacting engagement of the slit-and-bent parts 33 with the lower edge of the casing 11. Moreover, the cover surface 34 makes pressing contact with elastic contact strips (not shown) provided at specific parts of the ground pattern 22b.

The fabrication of the tuner unit 10 is thus completed.

The completed tuner unit 10 is mounted on the chassis of the apparatus in which it is to be used (not shown) by screws (not shown) passing through the holes 14a and the cuts 14b in the mounting plate parts 14 of the pair of case mounting lugs 12a and 12b. Here, since the pair of mounting lugs 12a and 12b are formed on the side walls 11c and 11d from which no terminals project, the screw fastening work can be carried out without interference. Moreover, since one mounting plate part 14 is formed with cuts 14b, the work of positioning the tuner unit upon mounting can be carried out with ease, and furthermore, the work of mounting and dismounting the device can be carried out very easily.

Furthermore, since the side walls 11a and 11c have no terminal holes or openings which might decrease their mechanical strength, the mounting lugs 12a and 12b themselves serve as fastening members with large mechanical strength and with stable mounting structure. Therefore, the other side walls 11b and 11d of the casing 11 are subjected to almost no deformation by the fastening force so that the terminals 19, and 23 through 25 are not adversely affected by deformation.

In a modified fabrication process, the board 17 is provisionally fitted into the casing 11 from its bottom opening and is engaged with the projection parts 16 and the slit-and-bent parts 15 are then formed to clamp the board 17 in cooperation with the projection parts 16.

Moreover, in another modified fabrication process, the board 17 is fitted into the casing 11 with its circuit elements 18 through 20 merely inserted therethrough. The assembled structure is then subjected to dip-soldering one time and the lead terminals 18a are thereafter cut off to the desired projection length (approximately 1 mm to 2 mm). With this fabrication process, dip-soldering need be performed one time. This modified fabrication process involving a single dip-soldering operation can be reduced to practical application because the mounting lugs 12a and 12b do not interfere with the work of cutting the lead terminals 18a.

A structure for provisionally clamping the board 17 may be modified such that the bridge-like projection parts 16 are disposed along the lower edge of the casing 11 and the slit-and-bent parts 15 are disposed near (but above) the lower edge of the casing 11. That is, in this arrangement, the positions of the projection parts 16 and the slit-and-bent parts 15 are reversed from those of the present embodiment. However, from the point of obtaining strong solder adherence, the present embodiment in which the slit-and-bent parts 15 are positioned on the lower surface of the board 17 is more advantageous.

Instead of the pair of mounting lugs 12a and 12b, it is possible to use mounting lugs like those shown in FIG. 9. In FIG. 9, each of mounting lugs 35a and 35b has side cuts 36a formed one on either side of an extending part 36. These side cuts 36a serve the same purpose as the openings 13a, that is to allow the fastening part 32 of the cover 31a to pass therethrough. Moreover, mounting lugs 37a and 37b indicated in FIG. 10 may be used. These mounting lugs 37a and 37b are respectively divided into three mounting lug segments 38a through 38c and 37a through 37c spaced at specific intervals. The fastening part 32 of the cover member 31a passes through the space between the adjacent segments.

Figure 12:
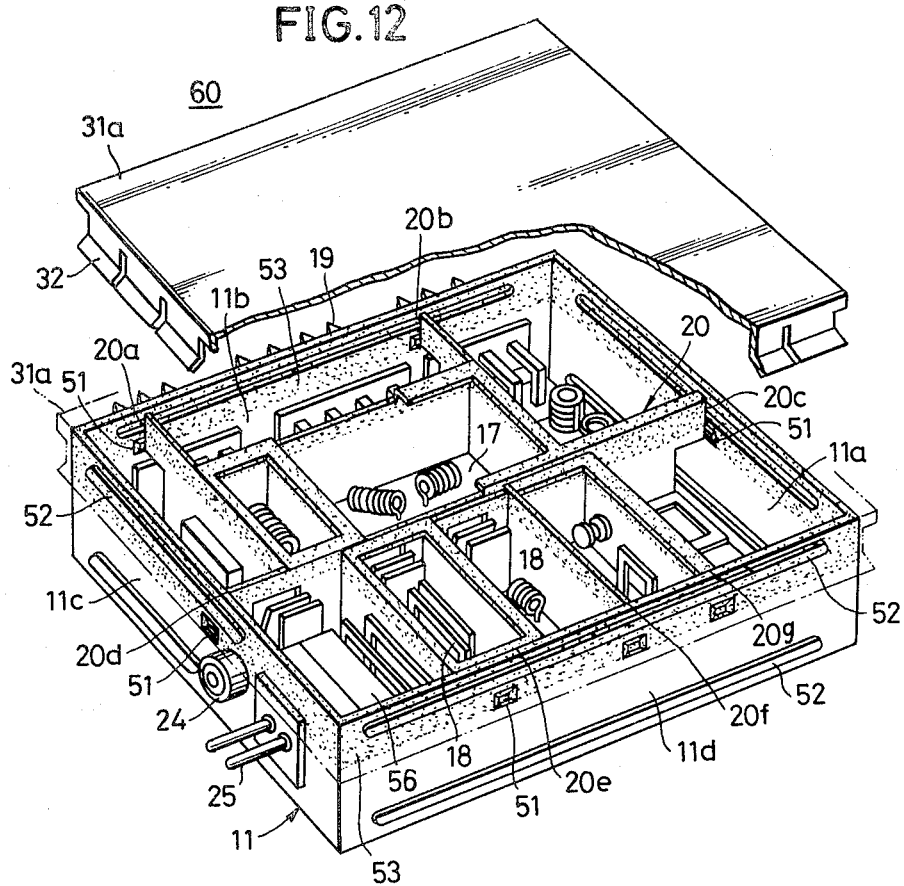

FIGS. 11 and 12 are perspective views showing other embodiments of the tuner unit in a state before and after being subjected to dip-soldering. In FIGS. 11 and 12, those parts which are the same as corresponding parts in FIGS. 1 and 2 are designated by like reference numerals, and detailed description of such parts will be omitted.

The tuner unit 50 indicated in FIG. 11 is a semicompleted product which, upon conpletion, becomes the completed tuner unit 60 indicated in FIG. 12. Side walls 11a through 11d of the casing 11 are provided with internal projection parts 51 which are formed by embossing near the top of the casing so as to confront the side edge surfaces 20a through 20g of the shield plate structure 20 described hereinafter and are further provided with pairs of projection beads 52 formed on the external side surface near the top and the bottom of the casing 11. The slit-and-bent parts 15 and the bridge-like projecting parts 16 in the embodiment indicated in FIG. 1 and FIG. 2 are not formed in the casing 11.

The shield plate structure 20 is pre-mounted on the printed circuit board 17 so as to divide the electrical circuit into several circuit sections. The top of the shield plate structure is substantially the same height throughout.

Figure 13:
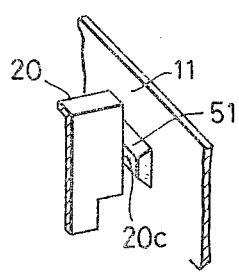
FIGS. 13, 14, and 15 are fragmentary perspective views respectively showing embodiments of the shield plate structure engagement structure of the tuner unit illustrated in FIG. 11.

The sub-assembly comprised of the printed circuit board 17 and the shield plate structure 20 is inserted into the casing 11 from, for example, the bottom opening thereof and the side edge surfaces 20a through 20g of the shield plate structure 20 are elastically pressed against the respective projection parts 51. The force of friction at this plurality of press-contact parts provisionally holds the printed circuit board 17 in the casing 11. The pressed contact state between the side edge surface 20c of the shield plate structure 20 and the projection part 51 of the casing 11 is shown in enlarged scale in FIG. 13.

The printed circuit board 17 (shield plate structure 20) can be provisionally held in position without any displacement within the casing 11 even when the semi-completed tuner unit 50 is turned upside down.

The semicompleted tuner unit 50 is then turned over and is subjected to dip-soldering, solder 53 thereby being adhered to the casing 11 as indicated by shaded portion in FIG. 12. The solder 53 adheres uniformly over the top surface of the shield plate structure 20 and the side surfaces near the top surface, and the top surface and side surfaces near the top surface of the casing 11, including the above described six contacting positions between the shield plate structure 20 and the casing 11. Thus, the shield plate structure 20 and the casing 11, that is the printed circuit board 17 and the casing 11, are secured positively and regidly. The shield plate segments contacting each other are also regidly fixed to each other near their tops.

Following this, the casing cover member 31a is attached to the casing 11 so as to cover the top opening thereof, with the fastening part 32 elastically engaging with the upper bead part 52. The bottom cover (not shown) is similarly attached to the casing 11. Thus the tuner unit 60 is now completed.

The solder 53 adheres at either side (upper or lower) of the projection bead 52 to form ramps which facilitate the attachment and detachment of the cover member 31a.

In the above described structural arrangement, the side edge surfaces 20a through 20g of the shield plate structure 20 and the projection part 51 of the casing 11 assume elastic contact with each other. Accordingly, when solder 53 adheres in the contact area, the members 20 and 11 are more positively fixed and electrically connected to each other, thus improving reliability to a higher level than is attainable in the conventional structural arrangement in which the side edge surfaces 20a through 20g and the inside side surface of the casing 11 make only elastic contact and are thus susceptible to the formation of gaps therebetween. Moreover, since the solder 53 is applied through dip-soldering, good solder adherence can be obtained and the time required for the soldering operation can be reduced to less than that required in conventional soldering using a soldering iron. Furthermore, the soldering process can be carried out automatically.

Furthermore, since the solder 53 is fully applied over all contacting parts between the shield plate segments 20 adjacent to each other, and between the shield plate structure 20 and the casing 11, the contact resistance is effectively reduced. Small contact resistance, coupled with no deviation in the set position of the shield plate structure 20, improves the Q-value of the circuit and prevents frequency deviation. Therefore, the tuner unit 60 exhibits stable tuning characteristics for a very long period of time.

Figure 14:
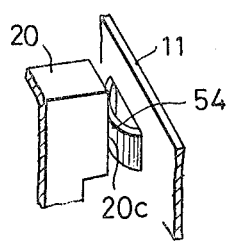
Figure 15:
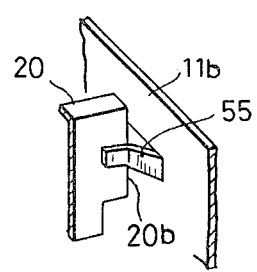

FIG. 14 and FIG. 15 show other embodiments of the press-contact construction between the shield plate structure 20 and the casing 11.

Referring to FIG. 14, a bridge-like internal projection part 54 is press-formed in the casing 11 and the shield plate structure 20 is elastically pressed at its side-edge surface 20c against the projection part 54 and is provisionally fixed.

Referring next to FIG. 15, instead of the internal projection 54 indicated in FIG. 14, internal projecting lugs 55 are press-formed in the casing 11. For example, the shield plate structure 20 is elastically clamped at its segments near the side edge surfaces 20a and 20b by means of a pair of projecting lugs 55 on the side wall 11b of the casing 11 and is thus provisionally retained.

Here, more stable provisional fixing can be obtained through a structural arrangement wherein, for example, the bottom surface of the board 17 contacts with the slit-and-bent parts 15 at the lower edge of the casing 11 when the shield plate structure 20 is provisionally fixed by either the projection parts 51 and 54 or the projecting lugs 55 as in the embodiments set forth above.

The circuit elements 18 and other circuit elements such as an antenna casing 56, all of which are at high positions near the top of the shield plate structure 20 in FIG. 11, are apt to come in contact with the molten solder upon the above dip-soldering operation. Therefore, when found necessary, the electrical elements are coated with a heat resisting coating material to prevent damage from solder heating.

Even in the case where the shield plate structure 20 is fabricated from plates pre-coated with metal plating, the side-edge surfaces 20through 20g which are cut surfaces are susceptable to rust and erosion. However, as the solder 53 adheres to the side-edge surfaces 20a through 20g of the shield plate structure during the dip-soldering operation, rust and corrosion are effectively prevented.

Moreover, when the cover member 31a is attached to the casing 11, slit-and-cut parts (not shown) press formed at specific positions on the cover member 31a come into contact with the top surfaces of the shield plate structure 20 to constitute a part of the ground circuit. As the top of the shield plate segment 20 is coated with solder 53, it is highly resistant to rust. Therefore, the electric conductive state at the contacting part is kept stable over a very long period of time.

The above dip-soldering operation can be carried out in the same manner even in the case where bent parts are formed at the top edge of the casing 11 or the shield plate structure 20.

In the tuner unit 60, the bottom surface of the board 17 is subjected to dip-soldering operation once or twice, as in the case of the tuner units 10 indicated in FIG. 1 and FIG. 2. Therefore, all soldering can be carried out by dip-soldering thus effectively reducing the amount of labor required for soldering.

The high-frequency circuit device according to the present invention has been described in respect of tuner units 10 and 60 which constitute typical embodiments thereof. The present invention, however, is not limited to such tuner units but may be applied to other various units of a construction wherein a printed circuit board and a shield plate structure are accommodated or fitted inside a casing.

Further, this invention is not limited to these embodiments but various variations and modifications may be made without departing from the scope of the invention.

What is claimed is:

1. A high-frequency circuit device comprising:
a metal shield casing with surrounding side walls;
a printed circuit board-shield plate segment assembly supported horizontally within said casing, comprising a printed circuit board having electrical elements thereon and shield plate segments which are perpendicular to said printed circuit board and define the electrical elements into a plurality of groups;
holding means for provisionally holding said assembly inside said casing so as to prevent displacement as between said case and said assembly through mechanical contact between said assembly and said casing; and solder parts for permanently fixing both the top of said shield plate segments and the bottom of said printed circuit board to said side walls of said casing by applying solder to corresponding positions in a state where said assembly is provisionally held to said casing by means of said provisional holding means, said provisional holding means comprising projection parts formed on said side walls of said casing, said projection parts bent from said side walls along a vertical axis and including vertex parts and said vertex parts of said projection parts making contact with the top of said shield plate segments of said assembly, said solder parts between the top of said shield plate segments and said projection parts being dip-soldered parts.

2. A high-frequency circuit device as claimed in claim 1, wherein the solder parts between the top of said shield plate segments, the side walls of said casing, and between the bottom of said printed circuit board are dip-soldered parts.

3. A high-frequency circuit device as claimed in claim 1, wherein said provisional holding means comprise projecting lugs formed on said side walls of said casing at positions confronting side edges of said shield plate segments, a pair of projecting lugs being provided for each position so as to make contact with the side edges of said shield plate segments, each of said side walls of said casing having projections projecting outwards at an upper or lower part of the outer surface, said projections being covered by a case cover so that soldered parts of the projections are covered by said case cover.

4. A high-frequency circuit device comprising:
a metal shield casing with surrounding front, rear, right, and left side walls;
a printed circuit board having electrical elements thereon and shield plate segments which are perpendicular to said printed circuit board; horizontal support means for holding said printed circuit board in a state where said printed circuit board is accommodated within said casing; and
solder parts permanently contacting both said printed circuit board and said shield plate segments and attaching them to said casing in a fixed manner by solder,
said support means being projection parts,
at least one projection part being provided on each of at least one pair of mutually confronting side walls of said casing and projecting inwardly in a mutually confronting manner, said projection parts bent from said side walls along a vertical axis, while perpendicularly making contact with one surface of said printed circuit board, and
said solder parts of said printed circuit board which are held by said projection parts being dip-soldered parts.

5. A high-frequency circuit device as claimed in claim 4, wherein said projection parts are bridge-like projections formed by cutting a pair of lateral slits in said side walls and inwardly deforming parts between the slits.

6. A high-frequency circuit device as claimed in claim 4, wherein said projection parts are slit-and-bent parts formed by inwardly bending parts cut along L-shaped grooves along an upper or lower edge or said side walls of said casing.

7. A high-frequency circuit device comprising:
a metal shield casing with surrounding front, rear, right, and left side walls,
a horizontally supported printed circuit board having electrical
elements thereon, and shield plate segments which are perpendicular to said printed circuit board and which defines the electrical
elements into a plurality of groups; means for holding said printed circuit board so that said printed circuit board is accommodated within said casing; and
solder parts for permanently holding said printed circuit board and said shield plate segments to said casing by solder, in the state where said printed circuit board is affixed
said affixing means being projection parts,
at least one projection part being provided on each of at least one part of mutually confronting side walls of said casing and projecting inwardly in a mutually confronting manner,
said projection parts bent from said side walls along a vertical
axis, while perpendicularly making contact with one surface of said printed circuit board, with at least one of said solder parts being dip-soldered parts.

8. A high-frequency circuit device as claimed in claim 7, wherein said projection parts are bridge-like projections formed by cutting a pair of lateral slits in said side walls and inwardly deforming parts between the slits.

9. A high-frequency circuit device as claimed in claim 7, wherein said projection parts are slit-and-bent parts formed by inwardly bending parts cut along L-shaped grooves at an upper or lower edge of said side walls of said casing.

10. A high-frequency circuit device comprising:
a printed circuit board comprising electrical elements and shield plate segments which are perpendicular to said printed circuit board,
said printed circuit board being held within a metal shield casing by a pair of projection parts, bent from the side walls along a vertical axis,
one of said projection parts being a bridge-like projection formed by cutting a pair of lateral slits in a side wall of said casing and inwardly deforming parts between the slits,
the other of said projection parts being a slit-and-bent part formed by inwardly bending a part cut along an L-shaped groove at an upper or lower edge of said side wall of said casing;
said printed circuit board being inserted from a side opening of said casing while pinched between said pair of projection parts, and thus fixed within said casing; and both said printed circuit board and said shield plate segments being fixed by solder to said casing.

* * * * *